(12) United States Patent
Fifield

(10) Patent No.: US 10,255,987 B1
(45) Date of Patent: Apr. 9, 2019

(54) MARGIN TEST FOR ONE-TIME PROGRAMMABLE MEMORY (OTPM) ARRAY WITH COMMON MODE CURRENT SOURCE

(71) Applicant: GLOBALFOUNDRIES INC., Grand Cayman (KY)

(72) Inventor: John A. Fifield, Burlington, VT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/730,107

(22) Filed: Oct. 11, 2017

(51) Int. Cl.
*G11C 29/12* (2006.01)
*G11C 29/50* (2006.01)

(52) U.S. Cl.
CPC ........ *G11C 29/50004* (2013.01); *G11C 2029/1204* (2013.01); *G11C 2029/5004* (2013.01); *G11C 2029/5006* (2013.01)

(58) Field of Classification Search
CPC ...... G11C 29/50004; G11C 2029/5004; G11C 2029/1204; G11C 2029/5006; G11C 16/28; G11C 16/26; G11C 16/0483; G11C 7/062; G11C 11/5642
See application file for complete search history.

(56) References Cited

U.S. PATENT DOCUMENTS

| | | | |
|---|---|---|---|
| 5,731,733 A | 3/1998 | Denham | |
| 7,136,322 B2 | 11/2006 | Brennan et al. | |
| 8,767,433 B2* | 7/2014 | Kurjanowicz | G11C 17/16 365/200 |
| 2003/0169622 A1* | 9/2003 | Ooishi | G11C 16/28 365/185.21 |
| 2004/0037127 A1* | 2/2004 | Lindhorst | G11C 16/0441 365/202 |
| 2010/0220517 A1* | 9/2010 | Okayama | G11C 7/20 365/158 |
| 2018/0277214 A1* | 9/2018 | Kurafuji | G11C 16/0441 |

OTHER PUBLICATIONS

Taiwanese Office Action and Search report in related TW Application No. 106146479 dated Jul. 9, 2018, 13 pages.
Taiwanese Office Action in related TW Application No. 106146479 dated Sep. 23, 2018, 15 pages.

* cited by examiner

*Primary Examiner* — Harry W Byrne
*Assistant Examiner* — Sultana Begum
(74) *Attorney, Agent, or Firm* — Michael LeStrange; Andrew M. Calderon; Roberts Mlotkowski Safran Cole & Calderon, P.C.

(57) ABSTRACT

The present disclosure relates to a structure which includes a current-mirror control node which is configured to adjust a current margin and provide the adjusted current margin to at least one one-time programmable memory (OTPM) cell.

19 Claims, 3 Drawing Sheets

MARGIN TEST FOR ONE-TIME PROGRAMMABLE MEMORY (OTPM) ARRAY WITH COMMON MODE CURRENT SOURCE

FIELD OF THE INVENTION

The present disclosure relates to a margin test, and more particularly, to a circuit and a method for margin testing for a one-time programmable memory (OTPM) array with a common mode current source.

BACKGROUND

A one-time programmable memory (OTPM) is programmed with a programming operation followed by a verification test. The robustness of the programmed data state is determined by performing a read-margin test after programming. The margin test is used to predict the amount of excess read-signal that exists to compensate for sensing noise, leakage, and other signal detractors. In the margin test, a predetermined sensing imbalance must be overcome to read the data as correct. If the data does not pass the margin test, additional programming operations are then performed.

An array of OTPM data cells are connected to differential current-sense amplifiers via true and complement bit line pairs. Stored data is sensed by sense amplifiers which resolve the differential cell currents into logical '1' or logical '0' data. Further, an OTPM data-cell may consist of a pair of field effect transistors (FETs) in which '1' and '0' data-states are stored by programming one of the FETs threshold voltages higher or lower than the other, resulting in a positive or negative difference in currents within the FET pair. Thus, a differential data-current is established which can be sensed by a current sensing sense amplifier. However, multiple programming in an OTPM can cause damage to an oxide of a FET.

SUMMARY

In an aspect of the disclosure, a structure includes a current-mirror control node which is configured to adjust a current margin and provide the adjusted current margin to at least one one-time programmable memory (OTPM) cell.

In another aspect of the disclosure, a structure includes a twin-cell NFET memory in a one-time programmable memory (OTPM) cell which is configured to program at least one write operation based on a current margin, and a current sense amplifier which is configured to adjust the current margin and provide the adjusted current margin to the twin-cell memory based on a current mirror control node.

In another aspect of the disclosure, a method includes adjusting a current margin in a current-mirror control node based on a plurality of input margin signals, providing the adjusted current margin to a twin-cell memory through a true bit line (BLT) and a complement bit line (BLC), sensing a current differential of the twin-cell memory; and latching a differential voltage based on the sensed current differential of the twin-cell memory.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to a margin test, and more particularly, to a circuit and a method for margin testing for a one-time programmable memory (OTPM) array with a common mode current source. In more specific embodiments, the present disclosure is an improved margin test which tracks the common-mode current levels of an OTPM cell.

In a non-volatile cell, a threshold voltage (Vt) shift is dependent on the charge being trapped in the oxide of a pair of field effect transistors (FETs). Programming the FETs increases the threshold voltage (Vt), which can raise the possibility of damaging the oxide (i.e., gate of an FET can be shorted to the source). When a failure occurs, the gate is shorted to the source or drain in the FET, depending on the bias conditions. Further, a one time programmable memory (OTPM) array uses a twin-cell and a pair of FETs to program the OTPM array. The twin-cell of the OTPM is a pair of thin oxide high threshold voltage (HVT) NFET base devices.

Further, the twin-cell of the OTPM includes a true NFET transistor and a complement NFET transistor. Each gate of the true NFET transistor and the complement NFET transistor is connected to a word line WL. The source of the true NFET transistor is connected to the source of the complement NFET transistor, and the sources of both the true NFET transistor and the complement NFET transistor are connected to a source line SL. The drain of the true NFET transistor is connected to a true bit line (BLT) and the drain of the complement NFET transistor is connected to a complement bit line (BLC).

In the twin-cell of the OTPM array, programming is performed with the word line WL and a source line SL elevated (i.e., an elevated source line (ESL)). Further, one of the bit lines (i.e., either BLT or BLC) is held to ground and the other bit line is floated. During programming, charge trapping will shift the threshold voltage (Vt) up on one of the NFETs (i.e., either the true NFET transistor or the complement NFET transistor) in the twin-cell, weakening the transistor. A sense amplifier can compare a differential current between the BLT and the BLC.

Figure 1:
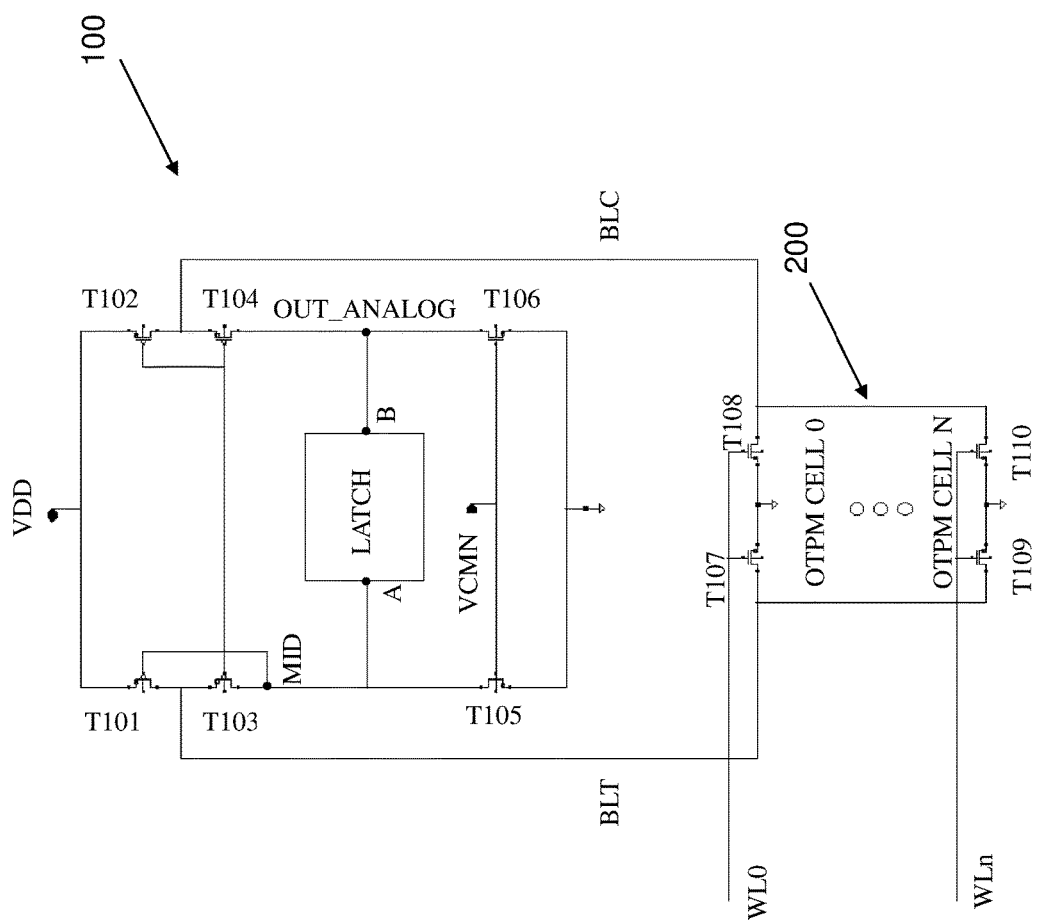
FIG. 1 shows a current sense amplifier with a margin adjustment in accordance with aspects of the present disclosure.

FIG. 1 shows a current sense amplifier with a margin adjustment in accordance with aspects of the present disclosure. In FIG. 1, the current sense amplifier 100 includes FETs T101-T106, a latch, a true bit line (BLT), a complement bit line (BLC), and a current-mirror source-voltage VCMN. FETs T101-T104 are PFET devices and T105 and T106 are NFET devices. The current sense amplifier 100 performs current sensing where the differential bit line current is converted to a voltage and latched as a digital "1" or digital "0". In embodiments, a BLT side of a selected cell (e.g., one cell of OTPM cell 0 to OTPM cell N) may have an FET with a higher threshold voltage than the corresponding FET on a BLC side.

In the present disclosure, selectable PFET current sources are in parallel with existing bit line current sources FET T101 and FET T102 during margin testing. Therefore, a drive level of these margin current sources FET T101 and FET T102 are not controlled by an invariant bandgap VCMN current reference, but are controlled by a bit line current mirror to each respective sense amplifier in an OTPM array 200. Each sense amplifier 100 has a node MID (i.e., current-mirror control node MID) which self-adjusts to provide the current required by selected cell devices. For example, when a cell of the OTPM array 200 is selected having a low threshold voltage (i.e., low Vt), current-mirror control node MID will drop to provide a required common-mode current. In a cell pair with a high threshold voltage (i.e., high Vt), current-mirror control node MID will rise to reduce a PFET drive to meet the lower common-mode current of that cell. Therefore, current-mirror control node MID can provide a current-mirror control-voltage which tracks with a common-mode current (CMC) of a selected OTPM cell of the OTPM array 200. In particular, the node MID can be used to control a margin test which tracks with the Vt voltages of a non-volatile array cell.

In FIG. 1, the current sense amplifier 100 includes a FET T101 which has a source connected to a voltage source VDD, a drain connected to a true bit line (BLT), and a gate connected to node MID. FET T103 has a source connected to the true bit line (BLT) and a gate and a drain connected to node MID. FET T102 has a source connected to power supply VDD, a drain connected to complement bit line (BLC), and a gate connected to node MID. FET T104 has a source connected to complement bit line (BLC), a drain connected to node OUT_ANALOG, and a gate connected to node MID. Further in FIG. 1, FET T105 has a drain connected to node MID, a gate connected to node VCMN, and a source connected to ground. FET T106 has a drain connected to node OUT_ANALOG, a gate connected to node VCMN, and a source connected to ground. A LATCH circuit has inputs node A and node B which are coupled respectively to node MID and to node OUT_ANALOG. Node VCMN is a constant current-source gate-voltage derived from an on-chip bandgap circuit.

In FIG. 1, the OTPM array 200 includes a twin-cell array which includes a gate of FET T107 and a gate of FET T108 connected to a word line WL0. The twin-cell memory (e.g., T107 and T108) is configured to program using a plurality of write operations. In addition, the OTPM array 200 can be a non-volatile memory which includes a group of OTPM cells along the true bit line (BLT) and the complement bit line (BLC), each of which contains a pair of field effect transistor (FET) devices (e.g., T107 and T108, T109 and T110).

In embodiments, a source of the FET T107 is connected to the source of the FET T108 and to ground. The drain of FET T107 is connected to the true bit line (BLT) and the drain of FET T108 is connected to the complement bit line (BLC). In the OTPM array 200, another twin-cell array includes a gate of FET T109 and a gate of FET T110 connected to a word line WLn. A source of the FET T109 is connected to the source of the FET T110 and to ground. The drain of FET T109 is connected to the true bit line (BLT) and the drain of FET T110 is connected to the complement bit line (BLC).

Still referring to FIG. 1, the FET devices (e.g., T107 and T108, T109, and T110) have threshold voltages (Vt) different from each other as a result of programming. For example, a first transistor (e.g., T107 or T109) has a different threshold voltage from a threshold voltage of a second transistor (e.g., T108 or T110). Also, transistors T107-T110 can be NFET devices. In embodiments, the FETs (e.g., T107 and T108) vary in strength from a normal variation in threshold voltage (i.e., Vt), gamma, and physical dimensions. In a perfectly matched FET pair, the currents would be identical in their un-programmed intrinsic states. The un-programmed cell current levels define the common-mode-current (CMC) flowing in bit line true (BLT) and in bit line complement (BLC). The common-mode cell current varies widely as the intrinsic un-programmed threshold voltages (i.e., Vts) vary about +/−30 mV across a memory array (e.g., OTPM array 200). The variation in FET strength can degrade an accuracy of a margin test and cause the margin test to under-test some cells and over-test other cells.

In further embodiments, the OTPM array 200 may include a group of OTPM cells including OTPM cell 0 to OTPM N, where N is the integer value representing the last OTPM cell of the OTPM array 200 (i.e., OTPM cell 0, OTPM cell 1, . . . , OTPM cell N). Each OTPM cell is coupled to a word line (e.g., one word line of word line WL0 to word line WLn). In embodiments, a plurality of memory cells (e.g., OTPM cell 0 to OTPM cell n) are arranged in differential transistor pairs (e.g., T107 and T108 or T109 and T110) and share a word line (e.g., word line WL0 to word line WLn).

In operation, a small bias current controlled by input VCMN may be applied to both the true side of the current sense amplifier 100 (i.e., a side with the true bit line (BLT)) and the complement side of the current sense amplifier 100 (i.e., a side with the complement bit line (BLC)) by NFETs T105 and T106. Then, conduction into a selected OTPM cell-pair causes node MID to drop and mirror current from FET T101 into FET T102. When currents into the true bit line (BLT) and the complement bit line (BLC) are unequal from a programming threshold voltage difference in the OTPM cells, a large voltage differential develops on the current sense amplifier 100 signal between nodes A and B. The large voltage differential (i.e., a difference between voltage_A and voltage_B) is then latched by a complementary metal-oxide-semiconductor (CMOS) latch and converted to a full voltage logic level "1" or "0". In embodiments, a current sense amplifier 100 is connected to an OTPM array 200. In particular, the OTPM array 200 is connected to the current sense amplifier 100 by bit lines BLT and BLC. The current sense amplifier 100 is configured to sense a current differential and latch a differential voltage based on the current differential.

In a normal read operation, a word line (WL) is activated and differential current is allowed to flow from field effect transistors (FETs) T101 and T102 into a selected OTPM cell. For example, a WL0 can be activated and differential current flows from FETs T101 and T102 into OTPM cell 0 (i.e., the OTPM cell 0 which comprises FETs T107 and T108). The differential current is converted to a differential voltage-signal on nodes "A" and "B" in FIG. 1 and then latched.

Figure 2:
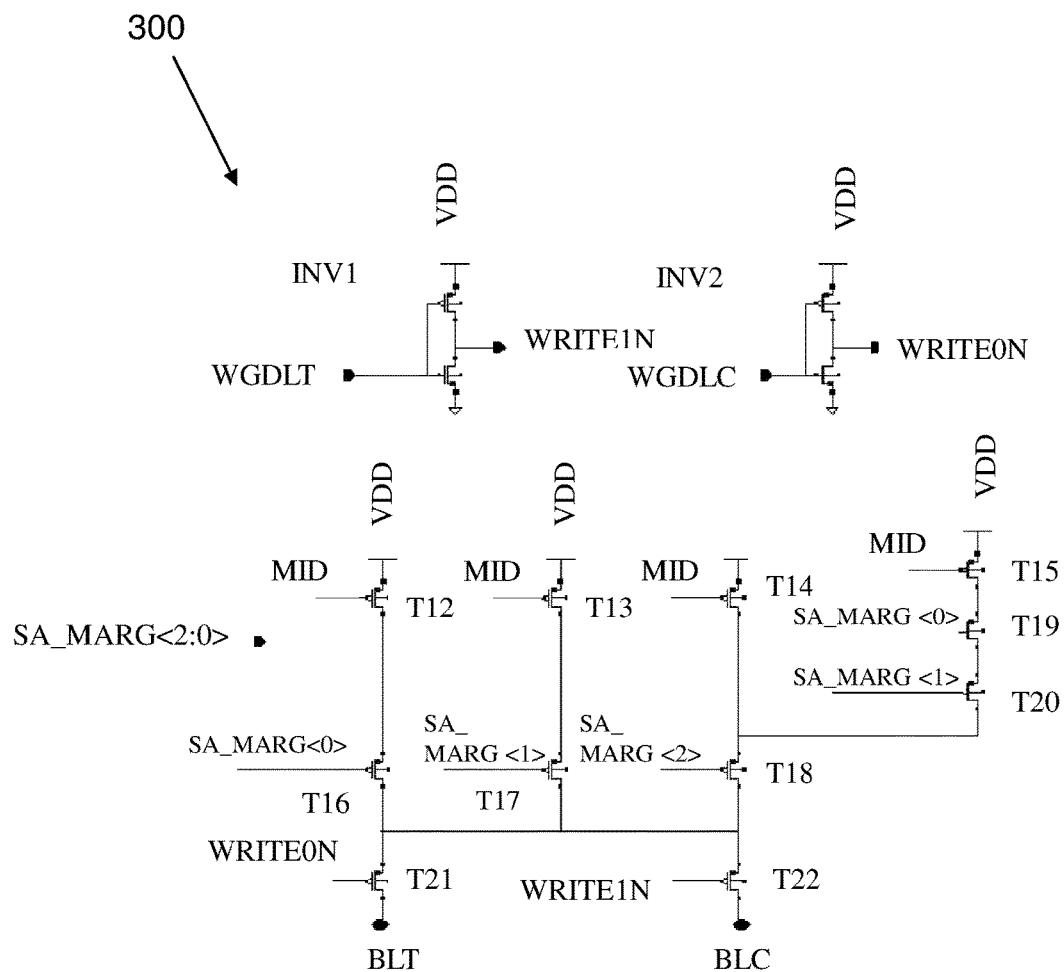
FIG. 2 shows a margin adjustment circuit in accordance with aspects of the present disclosure

FIG. 2 shows a margin adjustment circuit in accordance with aspects of the present disclosure. In FIG. 2, the margin adjustment circuit 300 includes FETs T12-T22, a write global data line true (WGDLT), a write global data line complement (WGDLC), a true bit line (BLT), a complement bit line (BLC), sense amplifier margin SA_MARG<2:0> (which includes SA_MARG<2>, SA_MARG<1>, and SA_MARG<0>), a signal which is connected to current-mirror control node MID (from FIG. 1), a first inverter INV1, a second inverter INV2, and signals WRITE1N, WRITE0N. In the margin adjustment circuit 300, a group of current sources are formed by FETs T12-T15 and controlled by the signal which is connected to current-mirror control node MID (from FIG. 1).

In FIG. 2, a magnitude of an offset current is selected by FETs T16, T17, and T18 (i.e., switch devices) which are responsive to SA_MARG<2>, SA_MARG<1>, and SA_MARG<0>. In FIG. 2, FETs T12-T22 are all PFET devices. In the margin adjustment circuit 300, FET T12 has a source connected to a power supply VDD, a gate connected to the signal which is connected to current-mirror control node MID, and a drain which is connected to a source of FET T16. FET T13 has a source connected to the power supply VDD, a gate connected to the signal which is connected to current-mirror control node MID, and a drain which is connected to a source of FET T17. FET T14 has a source connected to the power supply VDD, a gate connected to the signal which is connected to current-mirror control node MID, and a drain which is connected to a source of FET T18. FET T15 has a source connected to the power supply VDD, a gate connected to the signal which is connected to current-mirror control node MID, and a drain which is connected to the source of FET T19.

Still referring to FIG. 2, FET T16 has a source which is connected to the drain of FET T12, a gate which is connected to SA_MARG<0>, and a drain which is connected to a source of transistor T21. FET T17 has a source which is connected to the drain of FET T13, a gate which is connected to SA_MARG<1>, and a drain which is connected to the source of transistor T21. FET T18 has a source which is connected to the drain of FET T14, a gate which is connected to SA_MARG<1>, and a drain which is connected to the source of transistor T22.

In FIG. 2, FET T19 has a source which is connected to the drain of FET T15, a gate which is connected to SA_MARG<0>, and a drain which is connected to the source of FET T20. FET T20 has a source which is connected to the drain of FET T19, a gate which is connected to SA_MARG<1>, and a drain which is connected to the source of FET 18. FET T21 has a source which is connected to the drain of FET T16, a gate which is connected to signal WRITE0N, and a drain which is connected to BLT. FET 22 has a source which is connected to the drain of FET T18, a gate which is connected to signal WRITE1N, and a drain which is connected to BLC. Further, in inverter INV1, the write global data line true (WGDLT) is inverted to generate signal WRITE1N. In inverter INV2, the write global data line complement (WGDLC) is inverted to generate signal WRITE0N.

A current-mirror control node MID (which is also shown in FIG. 1) is connected to FETs T12, T13, T14, and T15 to control/adjust a margin-current which tracks with a selected cell's common-mode current (CMC) (i.e., the selected cell of the OTPM array 200 in FIG. 1). FETs T16, T17, and T18 are switch devices which gate the binary-weighted FET current sources into nodes which are connected to true bit line (BLT) or complement bit line (BLC) to effect a margin test by favoring or titling the sense-amplifier trip point in a direction unfavorable to the data being written to the selected cell.

In FIG. 2, a magnitude of an offset current is selected by transistors T16, T17, and T18 (i.e., current control switches), which are responsive to SA_MARG<2>, SA_MARG<1>, and SA_MARG<0>. Further binary settings from 0 to 7 are referred to as DAC inputs DAC0 to DAC7. In an example, by using sequential selection of DAC inputs, a signal offset can be enabled in 10 mV increments up to 70 mV. In other words, DAC0 is 0 mV (i.e., balance the current sense amplifier with no skew), DAC1 is 10 mV, DAC2 is 20 mV, DAC3 is 30 mV, DAC4 is 40 mV, DAC5 is 50 mV, DAC6 is 60 mV, and DAC7 is 70 mV.

In operation, the margin-current is steered to either BLT or BLC by data inputs write global data line true (WGDLT) or write global data line complement (WGDLC). For example, when writing a data value of "1" to an OTPM cell, it is expected that the node connected to BLT will draw less current than the node connected to BLC. Further, it is expected that the node connected to BLT will have a higher voltage than the node connected to BLC. Data input WGDLT is set high in this situation to drive WRITE1N to a low state to enable (i.e., turn on) FET T22. Margin-current flows into BLC and make the voltage rise, which reduces a "1" signal level. If the sense-amplifier has sufficient cell-signal to set correctly with the margin test offsetting the node connected to BLC, then the selected cell has margin to the level set by selection of FETs T16, T17, and T18 switch devices.

In embodiments, additional margin-current beyond the simple addition of binary weighted currents from FETs T12, T13, and T14 can be added by an additional current source T15. For example, additional current is enabled when all three margin bits SA_MARGIN<3:0> are selected. In this arrangement, the margin amount will progress in increments of the least significant bit (LSB) and then jump to the sum of all binary-weighted sources plus the additional current from FET T15. Therefore, an adjustable margin test is given with fine granularity at a low end, and a maximum test larger than a sum of all the binary increments. This maximum margin test can be useful to test for a gross imbalance in the OTPM array before programming to ensure that a tested cell of the OTPM array is capable of a normal programming margin.

Figure 3:
FIG. 3 shows a graph of the current sense amplifier with the margin adjustment in accordance with aspects of the present disclosure.

A known margin test offsets a sensing trip-point to favor the opposite data state. For example, to margin test a data with a value of "1" for 10 mV, a trip point would be moved to favor a value of "0" by 10 mV. A balanced trip point would have 0 mV offset. In known systems, a sense amplifier trip point can vary from about 15 mV to 30 mV in one configuration and 15 mV to 55 mV in another configuration. This variation of known systems causes uncertainty in the margin testing and can cause under-testing and over-programming resulting in oxide breakdown failures. FIG. 3 shows a graph of the current sense amplifier with the margin adjustment in accordance with aspects of the present disclosure. In FIG. 3, the graph 400 includes a first plot 410, a second plot 420, and a third plot 430 corresponding to a minimum, a medium, and a high word line voltage level. In each of these plots 410, 420, and 430, the x-axis corresponds to a cell signal difference of a FET threshold voltage (Vt) in millivolts (mV). Further, on the y-axis, a signal level at which the waveform crosses "0" is the sense amplifier trip point.

Plot 410 corresponds to a minimum word line voltage-level (i.e., WLDAC3) with a signal margin test of 20 mV. Plot 410 has a plurality of write waveforms at different process, voltage variations, and temperature settings. In plot 410, a signal level at which the waveforms cross "0" (i.e., the sense amplifier trip point) varies from about 19 mV-22 mV. This is an improvement over known margin tests with a similar configuration which varies from about 17 mV-35 mV (i.e., this variation causes uncertainty in the margin testing and can cause under-testing and over-programming resulting in oxide breakdown failures).

Plot 420 corresponds to a medium word line voltage-level (i.e., WLDAC4). Plot 420 also has a plurality of write waveforms at different process, voltage variations, and temperature settings. In plot 420, a signal level at which the waveforms cross "0" (i.e., the sense amplifier trip point)

varies from about 20 mV-23 mV. This is an improvement over known margin tests with a similar configuration which varies from about 17 mV-35 mV (i.e., this variation causes uncertainty in the margin testing and can cause under-testing and over-programming resulting in oxide breakdown failures).

Plot 430 corresponds to high word line voltage-level (WLDAC5). Plot 430 also has a plurality of write waveforms at different process, voltage variations, and temperature settings. In the plot 430, a signal level at which the waveform cross "0" (i.e., the sense amplifier trip point) varies from about 21 mV-24 mV. This is an improvement over known margin tests with a similar configuration which varies from about 17 mV-55 mV (i.e., this variation causes uncertainty in the margin testing and can cause under-testing and over-programming resulting in oxide breakdown failures). Thus, as shown in the graph 400, uncertainty in margin testing and oxide breakdown failures in the present disclosure is reduced in comparison to known margin testing.

The circuit and method for margin testing for a one-time programmable memory (OTPM) array with a common mode current source of the present disclosure can be manufactured in a number of ways using a number of different tools. In general, though, the methodologies and tools are used to form structures with dimensions in the micrometer and nanometer scale. The methodologies, i.e., technologies, employed to manufacture the circuit and method for margin testing for a one-time programmable memory (OTPM) array with a common mode current source of the present disclosure has been adopted from integrated circuit (IC) technology. For example, the structures are built on wafers and are realized in films of material patterned by photolithographic processes on the top of a wafer. In particular, the fabrication of the circuit and a method for margin testing for a one-time programmable memory (OTPM) array with a common mode current source uses three basic building blocks: (i) deposition of thin films of material on a substrate, (ii) applying a patterned mask on top of the films by photolithographic imaging, and (iii) etching the films selectively to the mask.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure comprising:
   a current-mirror control node which is configured to adjust a current margin and provide the adjusted current margin to at least one one-time programmable memory (OTPM) cell; and
   a twin-cell memory in the OTPM cell which is configured to be programmable using a plurality of write operations based on the adjusted current margin,
   wherein the twin-cell memory comprises a pair of NFET devices with different threshold voltages,
   the pair of NFET devices comprises a true NFET transistor and a complement NFET transistor, and
   a word line is connected to a gate of the true NFET transistor and a gate of the complement NFET transistor.

2. The structure of claim 1, further comprising:
   a current sense amplifier which is connected to the twin-cell memory and is configured to sense a current differential of the twin-cell memory and latch a differential voltage based on the current differential.

3. The structure of claim 2, wherein the current sense amplifier comprises a plurality of PFET devices and each of the PFET devices has a gate which is commonly connected to the current-mirror control node.

4. The structure of claim 3, wherein the plurality of PFET devices are configured to adjust the current margin to a true bit line (BLT) and a complement bit line (BLC) of the current sense amplifier to create the differential voltage.

5. The structure of claim 2, wherein the current sense amplifier comprises a latch which is configured to store the differential voltage.

6. The structure of claim 2, wherein the current sense amplifier is connected to the twin-cell memory array through a true bit line (BLT) and a complement bit line (BLC).

7. The structure of claim 1, further comprising a margin adjustment circuit which includes a plurality of transistors and is connected to the current sense amplifier through a true bit line (BLT), a complement bit line (BLC), and the current-mirror control node.

8. The structure of claim 7, wherein the plurality of transistors in the margin adjustment circuit are PFET devices which determine a magnitude of the current margin based on a plurality of sense amplifier input margin signals.

9. A structure comprising:
   a twin-cell NFET memory in a one-time programmable memory (OTPM) cell which is configured to program at least one write operation based on a current margin; and
   a current sense amplifier which is configured to adjust the current margin and provide the adjusted current margin to the twin-cell memory based on a current mirror control node,
   wherein the twin-cell NFET memory comprises a pair of NFET devices with different threshold voltages,
   the pair of NFET devices comprises a true NFET transistor and a complement NFET transistor, and
   a word line is connected to a gate of the true NFET transistor and a gate of the complement NFET transistor.

10. The structure of claim 9, wherein the current mirror control node is configured to adjust the current margin and provide the adjusted current margin to the twin-cell memory in the OTPM cell.

11. The structure of claim 9, wherein the current sense amplifier comprises a plurality of PFET devices and each of the PFET devices has a gate which is commonly connected to the current-mirror control node.

12. The structure of claim 11, wherein the plurality of PFET devices are configured to adjust the current margin to a true bit line (BLT) and a complement bit line (BLC) of the current sense amplifier to create a differential voltage.

13. The structure of claim 12, wherein the current sense amplifier is further configured to sense a current differential of the twin-cell memory and latch the differential voltage based on the current differential.

14. The structure of claim 9, wherein the current sense amplifier is connected to the twin-cell memory array through a true bit line (BLT) and a complement bit line (BLC).

15. The structure of claim 9, further comprising a margin adjustment circuit which includes a plurality of transistors and is connected to the current sense amplifier through a true bit line (BLT), a complement bit line (BLC), and the current-mirror control node.

16. The structure of claim 15, wherein the plurality of transistors determine a magnitude of the current margin based on a plurality of sense amplifier input margin signals.

17. The structure of claim 16, wherein the plurality of transistors in the margin adjustment circuit are PFET devices.

18. A method, comprising:
adjusting a current margin in a current-mirror control node based on a plurality of input margin signals;
providing the adjusted current margin to a twin-cell memory through a true bit line (BLT) and a complement bit line (BLC);
sensing a current differential of the twin-cell memory; and
latching a differential voltage based on the sensed current differential of the twin-cell memory,
wherein the twin-cell memory comprises a pair of NFET devices with different threshold voltages,
the pair of NFET devices comprises a true NFET transistor and a complement NFET transistor, and
a word line is connected to a gate of the true NFET transistor and a gate of the complement NFET transistor.

19. The method of claim 18, wherein the adjusting the current margin in the current-mirror control node based on the plurality of input margin signals further comprises adjusting a margin level of the current margin set by a number of selected parallel current supply devices controlled by the current-mirror control node in a current sense amplifier, the margin level tracks with a threshold voltage (Vt) variation of a plurality of OTPM cells.

* * * * *